United States Patent
Bichotte et al.

(10) Patent No.: US 10,969,679 B2
(45) Date of Patent: Apr. 6, 2021

(54) SYSTEM AND METHOD FOR PRODUCING AN OPTICAL MASK FOR SURFACE MICROTEXTURING, AND SURFACE MICROTEXTURING PLANT AND METHOD

(71) Applicants: H.E.F., Andrezieux Boutheon (FR); UNIVERSITE JEAN MONNET SAINT ETIENNE, Saint Etienne (FR); CENTRE NATIONAL DE LA RECHERCHE SCIENTIFIQUE (CNRS), Paris (FR)

(72) Inventors: Maxime Bichotte, Haguenau (FR); Yves Jourlin, Saint Etienne (FR); Laurent Dubost, Chamboeuf (FR)

(73) Assignees: H.E.F., Andrezieux Boutheon (FR); Universite Jean Monnet Saint Etienne, Saint Etienne (FR); Centre National De La Recherche Scientifique (CNRS), Paris (FR)

( * ) Notice: Subject to any disclaimer, the term of this patent is extended or adjusted under 35 U.S.C. 154(b) by 317 days.

(21) Appl. No.: 16/311,293

(22) PCT Filed: Jun. 21, 2017

(86) PCT No.: PCT/FR2017/051649
§ 371 (c)(1),
(2) Date: Dec. 19, 2018

(87) PCT Pub. No.: WO2017/220930
PCT Pub. Date: Dec. 28, 2017

(65) Prior Publication Data
US 2019/0187567 A1 Jun. 20, 2019

(30) Foreign Application Priority Data

Jun. 21, 2016 (FR) ...................... 1655753

(51) Int. Cl.
*G03F 1/68* (2012.01)
*G03F 7/20* (2006.01)
*G03F 1/76* (2012.01)

(52) U.S. Cl.
CPC ............ *G03F 1/68* (2013.01); *G03F 7/70216* (2013.01); *G03F 1/76* (2013.01)

(58) Field of Classification Search
CPC .............................. G03F 1/68; G03F 7/70216
USPC ........................................................... 430/5
See application file for complete search history.

(56) References Cited

FOREIGN PATENT DOCUMENTS

| EP | 0759578 | 2/1997 |
|----|---------|--------|
| EP | 0994378 | 4/2000 |
| EP | 1652009 | 3/2007 |
| GB | 2253925 | 9/1992 |

OTHER PUBLICATIONS

International Search Report (English) and Written Opinion dated Aug. 18, 2017, from International Application No. PCT/FR2017/051649, 15 pages.
Varanasi, K. et al. "Spatial control in the heterogeneous nucleation of water", Applied Physics Letters, vol. 95, No. 9, Aug. 31, 2009, pp. 94101.
Wang, X. et al. "Femtosecond laser-induced mesoporous structures on silicon surface", Optics Communications 284 (2011) 317-321.
Ma, Y. et al. "Processing study of SU-8 pillar profiles with high aspect ratio by electron-beam lithography", Microelectronic Engineering 149 (2016) 141-144.
Mojarad, N. et al. "Interference lithography at EUV and soft X-ray wavelengths: Principles, methods, and applications", Microelectronic Engineering 143 (2015) 55-63.
Brueck, S.R.J. "Optical and Interferometric Lithography—Nanotechnology Enablers", Fellow, Proceedings of the IEEE, vol. 93, No. 10, October 2005.
Ai, B. et al. Plasmonic films based on colloidal lithography:, Advances in Colloid and Interface Science 206 (2014) 5-16.
Kosinova, A. et al. "Fabrication of hollow gold nanoparticles by dewetting, dealloying and coarsening", Acta Materialia 102 (2016) 108-115.
Vigneswaran, N. et al. "Recent Advances in Nano Patterning and Nano Imprint Lithography for Biological Applications", Procedia Engineering 97 (2014) 1387-1398.

*Primary Examiner* — Christopher G Young
(74) *Attorney, Agent, or Firm* — Meunier Carlin & Curfman LLC

(57) ABSTRACT

The invention relates to a system (2) for producing an optical mask (35) for surface microtexturing, said system (2) comprising: a substrate (10) having a surface (11) that is to be textured; a layer of material (20) which covers the surface (11) of the substrate (10) and has an outer surface (21) that is exposed to the outside environment; and a generating and depositing device for generating and depositing droplets (30) on the outer surface (21) of the layer of material (20), in a specific arrangement (31) under condensation, forming the optical mask (35) on the outer surface (21) of the layer of material (20). The invention also relates to a treatment plant comprising a system (2) of said type. The invention further relates to a method for producing a mask as well as to a surface microtexturing method.

12 Claims, 9 Drawing Sheets

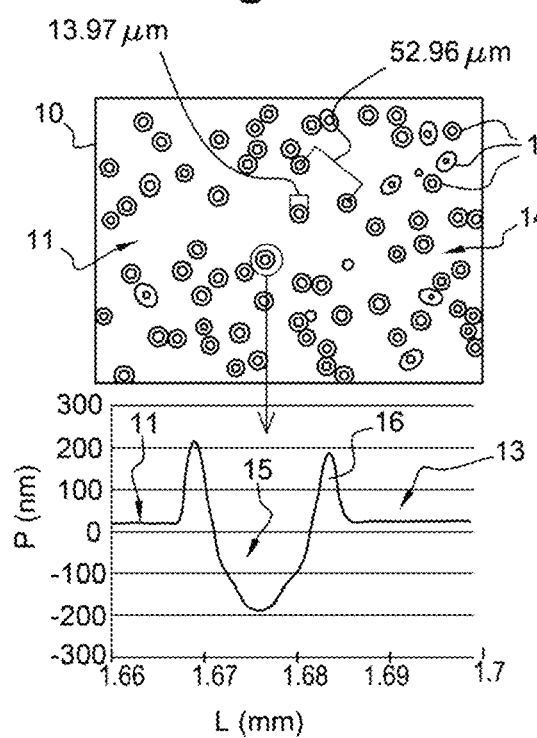
Fig. 14
Fig. 15
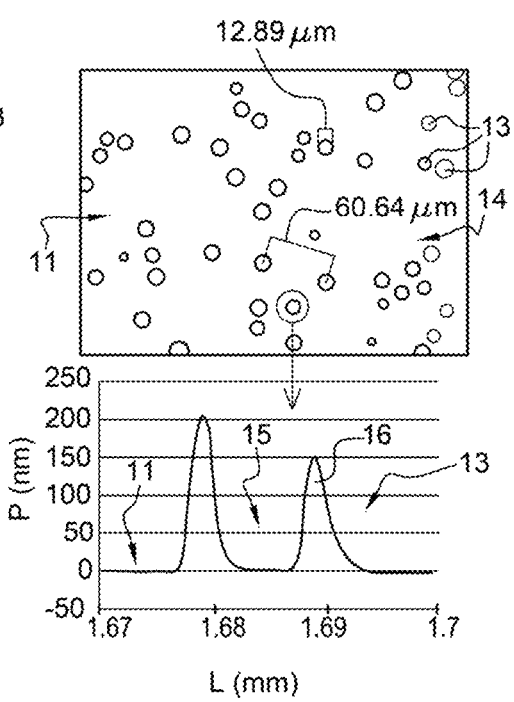
Fig. 16
Fig. 17
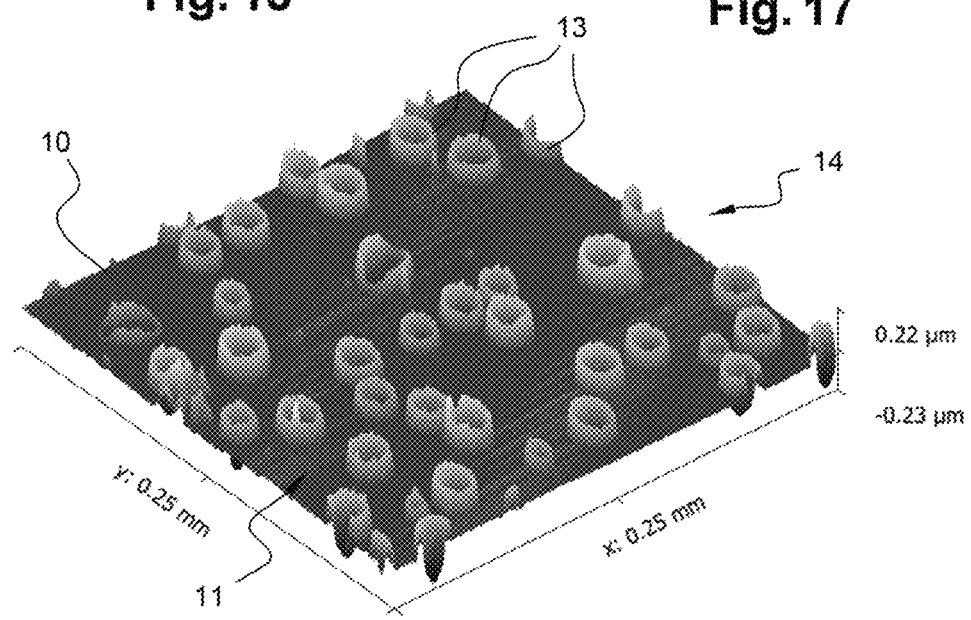
Fig. 18

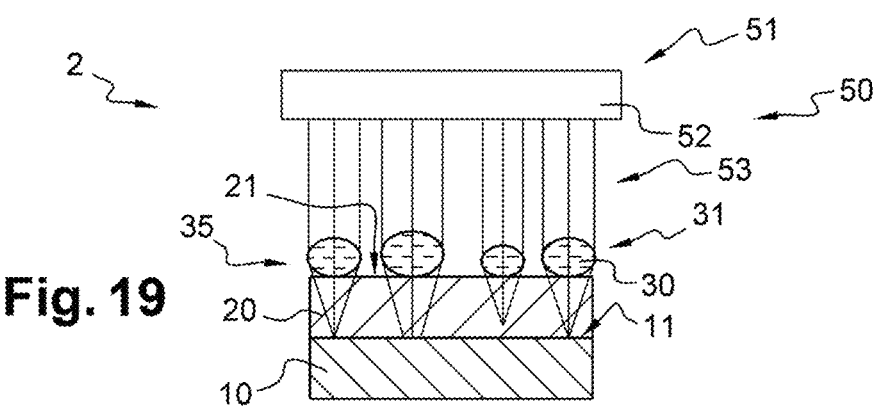
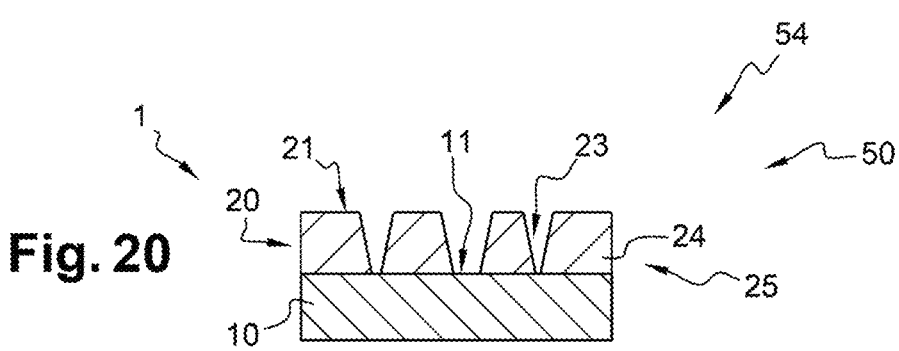
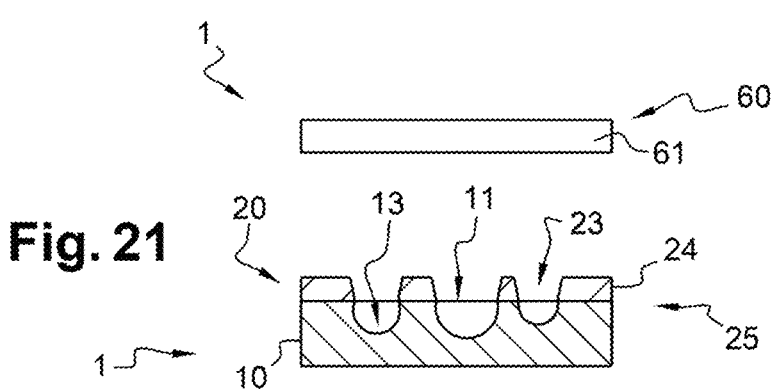
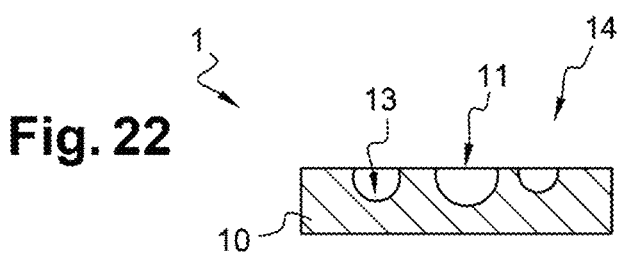

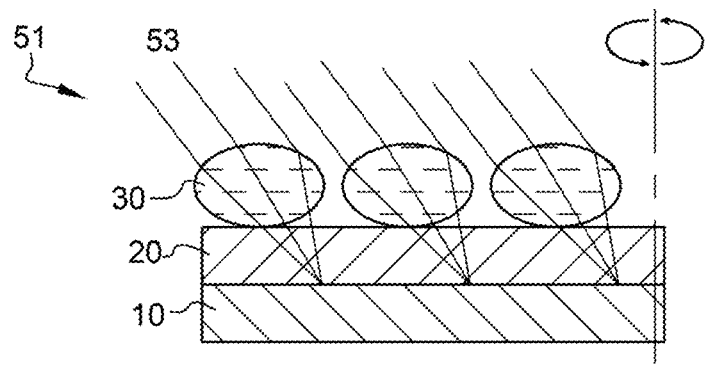
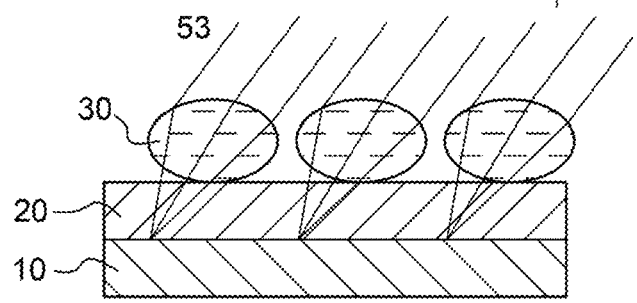
Fig. 26
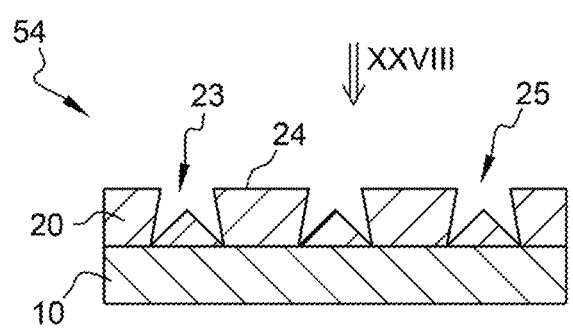
Fig. 27
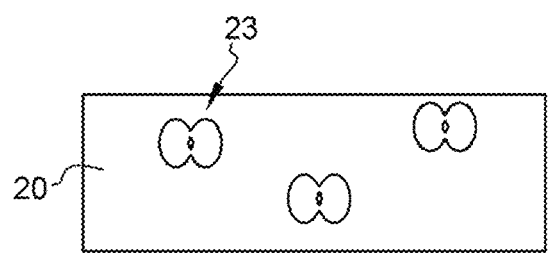
Fig. 28

SYSTEM AND METHOD FOR PRODUCING AN OPTICAL MASK FOR SURFACE MICROTEXTURING, AND SURFACE MICROTEXTURING PLANT AND METHOD

TECHNICAL FIELD

The present invention relates to a system and a method for producing an optical mask for surface microtexturing. The invention also relates to a plant and a method for surface microtexturing.

BACKGROUND

In the context of the invention, the optical mask is made up of droplets deposited on a surface exposed to the outside environment. According to a first embodiment, the droplets are used as focusing optics, to concentrate a light flow on the surface. According to a second embodiment, the droplets are used as optics for occultation, to obstruct a light flow oriented onto the surface.

The field of the invention is that of masking methods, as well as surface microtexturing methods, in particular by photolithography and laser etching.

Currently, various methods exist for texturing surfaces. These methods can be classified in two categories, namely direct methods on the one hand and indirect methods involving using a mask on the other hand. In this case, the resulting structure corresponds to the negative of the mask.

Direct texturing methods can implement a UV optical beam, an electron-beam ("e-beam"), a laser beam, fast atom bombardment (FAB), reactive ion beam etching (RIBE). These methods make it possible to obtain complex and varied shapes by direct ablation of a surface, but are not suitable for structuring large surface areas and non-planar substrates. Furthermore, these methods have a generally high cost. Publications [1] and [2] below relate to such methods.

Indirect texturing methods may implement amplitude masks, phase masks, nanobeads, interferometric lithography, dewetting. However, these methods also have their own inherent drawbacks.

The principle of amplitude masks and phase masks lies in a contrast in lighting of the surface to obtain a periodic pattern (diffraction grating) in a photosensitive material layer. They may be expensive for small periods, of the micronic or submicronic order (manufacturing by electron beam), and are not flexible in terms of sizes and shapes of the resulting structures. The dimensions of the structures depend on the dimensions of the mask. The resulting structures are highly coherent, i.e., they have a regular period for the considered wavelength. However, it is difficult to treat large surfaces. Publication [3] below relates to such methods.

Holography uses a laser beam separated into two branches, then recombined on the surface of a specimen covered with photosensitive resin. The interferogram (periodic intensity fringes) then formed defines the resulting diffraction grating. Holography makes it possible to act on the period of the resulting structure, but requires the use of a laser and a complex optical assembly. It is possible to treat large surfaces, although this requires substantial equipment. Publication [4] below relates to such a method.

The use of nanobeads (colloidal lithography) focusing the light or serving as a mask makes it possible to texture large surfaces with a periodic structure. The size of the beads is nevertheless set beforehand. This method requires having a machine for depositing Langmuir-Blodgett type films. In this case, the pattern is imparted by the size of the beads. Publication [5] below relates to such a method.

Dewetting allows the formation of metal nanoparticles by acting on the surface tension of a layer of noble metal. The surface is covered with a nanometric layer of noble metal (e.g. gold, silver) by physical vapor deposition (PVD). At a high temperature, the deposited layer forms noble metal nanoparticles in order to minimize its surface energy. As a result, dewetting is not suitable for texturing surfaces that are sensitive to high temperatures or vacuums. Furthermore, the formed particles measure only several tens of nanometers. Publication [6] below relates to such a method.

Nanoimprint lithography (NIL) uses a gauge (or mold) to print a shape by exerting pressure on a layer of malleable resin. The printed shape is next stabilized by exposure under an ultraviolet bulb or by slow cooling of the layer of resin. This step promotes hardening of the resin by cross-linking of the polymer chains. Nanoimprint lithography has the advantage of being inexpensive, but deterioration of the gauge can be observed after a certain number of uses. The removal step is also sensitive and may leave flaws visible in the structure. Publication [7] below relates to such a method.

The bibliographical references of the aforementioned publications are as follows:

[1] Femtosecond laser-induced mesoporous structures on silicon surface, Xianhua Wang, Feng Chen, Hewei Liu, Weiwei Liang, Qing Yang, Jinhai Si, Xun Hou, Optics Communications 284 (2011) 317-321

[2] Processing study of SU-8 pillar profiles with high aspect ratio by electron-beam lithography, Yaqi Ma, Yifan Xia, Jianpeng Liu, Sichao Zhang, Jinhai Shao, Bing-Rui Lu, Yifang Chen, Microelectronic Engineering 149 (2016) 141-144

[3] Interference lithography at EUV and soft X-ray wavelengths: Principles, methods, and applications, Nassir Mojarad, Jens Gobrecht, Yasin Ekinci, Microelectronic Engineering 143 (2015) 55-63

[4] Optical and Interferometric Lithography-Nanotechnology Enablers, S. R. J. BRUECK, FELLOW, PROCEEDINGS OF THE IEEE, VOL. 93, NO. 10, OCTOBER 2005

[5] Plasmonic films based on colloidal lithography, Bin Ai, Ye Yu, Helmuth Möhwald, Gang Zhang, Bai Yang, Advances in Colloid and Interface Science 206 (2014) 5-16

[6] Fabrication of hollow gold nanoparticles by dewetting, dealloying and coarsening, Anna Kosinova, Dong Wang, Peter Schaaf, Oleg Kovalenko, Leonid Klinger, Eugen Rabkin, Acta Materialia 102 (2016) 108-115

[7] Recent Advances in Nano Patterning and Nano Imprint Lithography for Biological Applications, N. Vigneswaran, Fahmi Samsuri, Balu Ranganathan, Padmapriya, Procedia Engineering 97 (2014) 1387-1398

The texturing methods described above have various drawbacks. These methods are relatively expensive and/or poorly suited to three-dimensional substrates and/or complex to carry out. Furthermore, these methods are generally intended for applications requiring regular microtexturing profiles, which have very precise periodicities and alignments. However, this regularity is not essential for all applications. Thus, the over-quality and therefore the excess cost induced by these methods may hinder their implementation in new applications. Furthermore, some applications on the contrary require a very large spatial distribution (in size and periodicity).

SUMMARY

The aim of the present invention is to propose improved systems and methods for producing a mask, as well as microtexturing of a surface.

To that end, the invention relates to a system for producing an optical mask for surface microtexturing, the system comprising: a substrate having a surface to be textured; a layer of material which covers the surface of the substrate and has an outer surface that is exposed to the outside environment; and a generating and depositing device for generating and depositing droplets on the outer surface of the layer of material, in a specific arrangement by condensation, forming the optical mask on the outer surface of the layer of material.

Thus, by using the droplets as optics for concentration or occultation, the invention makes it possible to produce a mask for a very low cost compared with most of the existing methods. The droplets are easy to form, then to clean. The invention does not require the implementation of devices for positioning optical systems with a submicronic precision, or implementing a Langmuir-Blodgett machine. The invention also makes it possible to avoid the problems of deterioration of the mold inherent to nanoimprint lithography technologies. Unlike dewetting, the invention does not require problematic annealing for materials that are sensitive to high temperatures.

Furthermore, the invention makes it possible to treat large surfaces, as well as differently shape substrates: curved, spherical, parabolic, cylindrical-circular or any other complex geometry.

The present invention may be applicable in many technical fields: photolithography, optics, mechanics, electromagnetism, tribology, chemistry, biology, etc. In optics, these applications in particular relate to optical trapping, light diffusion, the production of black bodies, anti-reflection coatings. In fluid mechanics, these applications in particular relate to hydrodynamics, the sharkskin effect, the golf ball effect, the turbulent boundary layer. In tribology, one application relates to the lubrication of contact interfaces. In chemistry, one application relates to increasing the specific surface in the context of catalysis, or producing SERS (surface enhanced Raman scattering) effect sensors. Other applications relate to the wettability of surfaces, hydrophobicity, etc.

According to other advantageous features of the system for producing an optical mask according to the invention, taken in isolation or in combination:

The generating and depositing device comprises a closed chamber, having a gaseous atmosphere with a controlled temperature and humidity, such that the droplets condense in a controlled manner on the outer surface of the layer of material.

The generating and depositing device comprises a unit for cooling a lower surface of the layer of material.

The generating and depositing device comprises a unit for monitoring, by imaging, the arrangement of the droplets on the outer surface of the layer of material.

The droplets are made up of water, an aqueous solution, oil, liquid polymer (for example silicone) or metal.

The invention also relates to a plant for surface microtexturing.

According to one particular embodiment, the microtexturing plant comprises: a system for producing an optical mask as mentioned above; a localized removal device for localized removal of the layer of material, based on the arrangement of the droplets forming the optical mask on the outer surface, which then includes removal zones and material zones forming a second mask on the substrate; and a microtexturing device for microtexturing the surface of the substrate, through the mask formed by the layer of material on the substrate.

The location of the removal depends on the arrangement of the droplets forming the optical mask. The removal is done through said optical mask.

According to other advantageous features of the microtexturing plant according to the invention, taken in isolation or in combination:

The layer of material is made from photosensitive material and the localized removal device for the layer of material comprises, on the one hand, an exposure unit emitting a light flow that passes through the droplets and reaches the outer surface of the layer of material, and on the other hand, a unit for developing the layer of material after exposure to the light flow.

The layer of material is made from positive photosensitive material, such that the removal zones of the layer of material are located directly below the droplets.

The layer of material is made from negative photosensitive material, such that the removal zones of the layer of material are located around and between the droplets.

The localized removal device is a microtexturing device, for example comprising a reactive ion etching unit, a chemical etching unit or an optical etching unit.

The exposure unit comprises a light source that is tilted relative to a direction normal to the outer surface of the layer of material, and the light flow passes through the droplets and reaches the outer surface of the layer of material under oblique incidence.

The light source is mounted on a hemispherical rail.

The exposure unit comprises a platen receiving the substrate and rotatable to turn the layer of material relative to the light flow.

The invention also relates to a method for producing an optical mask for surface microtexturing. This method comprises the following steps: a step of providing a substrate having a surface to be textured; a step of providing a layer of material which covers the surface of the substrate and has an outer surface that is exposed to the outside environment; and a step of generating and depositing droplets on the outer surface of the layer of material, in a specific arrangement, thus forming the optical mask on the outer surface of the layer of material.

The invention also relates to a method for surface microtexturing, comprising the following successive steps:

a) a step of providing a substrate that includes a surface to be textured;

b) a step of providing a layer of material which covers the surface of the substrate and has an outer surface that is exposed to the outside environment;

c) a step of generating and depositing droplets on the outer surface of the layer of material, in a specific arrangement by condensation, thus forming the optical mask on the outer surface of the layer of material;

d) a step of the localized removal of the layer of material based on the arrangement of the droplets forming the optical mask on the outer surface, which then includes removal zones and material zones forming a second mask on the substrate; and e) a of for microtexturing of the surface of the substrate through the second mask formed by the layer of material on the substrate.

If needed, step c) is repeated several times to change the arrangement of the droplets forming the optical mask, before performing step d) of localized removal of the layer of material.

According to other advantageous features of the methods according to the invention, taken in isolation or in combination:

In the supply step, the layer of material is positioned in a closed chamber, which has a gaseous atmosphere having a controlled temperature and humidity, and in the generating and depositing step, the droplets condense on the outer surface of the layer of material.

The layer of material is made from photosensitive material, and the step of localized removal of the layer of material first implements a sub-step of exposure of the layer of material through droplets, and secondly implements a sub-step of developing the layer of material after installation.

The layer of material is made from positive photosensitive material, such that the localized removal zones of the layer of material are located directly below the droplets.

The layer of material is made from negative photosensitive material, such that the localized removal zones of the layer of material are located around and between the droplets.

During the step of localized removal of the layer of material, a light flow passes through the droplets and reaches the outer surface of the layer of material under oblique incidence. According to one particular embodiment, the layer of material pivots relative to the light flow between two exposures, such that the layer of material is exposed under different oblique incidences.

BRIEF DESCRIPTION OF THE DRAWINGS

The invention will be better understood upon reading the following description, given solely as a non-limiting example, and made with reference to the accompanying figures wherein:

FIG. 14 is a top view of another example substrate including a textured surface according to the invention;

FIG. 15 is a cross-section of a cavity formed on the textured surface of FIG. 14;

FIGS. 16 and 17 are respectively similar to FIGS. 14 and 15, for another example substrate including a textured surface according to the invention;

FIG. 18 is a perspective view, obtained using a tactile profilometer, of another example substrate having a textured surface according to the invention;

FIGS. 19 to 22 are sectional views respectively similar to FIGS. 6 to 9, for an alternative of the invention implementing a negative photosensitive resin;

FIGS. 26 and 27 are sections analogous respectively to FIGS. 23 and 24, for an alternative of the invention implementing an oblique beam, tilted in two opposite directions at 180°;

FIG. 28 is a top view of the resin layer after developing, along arrow XXVIII in FIG. 27;

DETAILED DESCRIPTION

Figure 1:
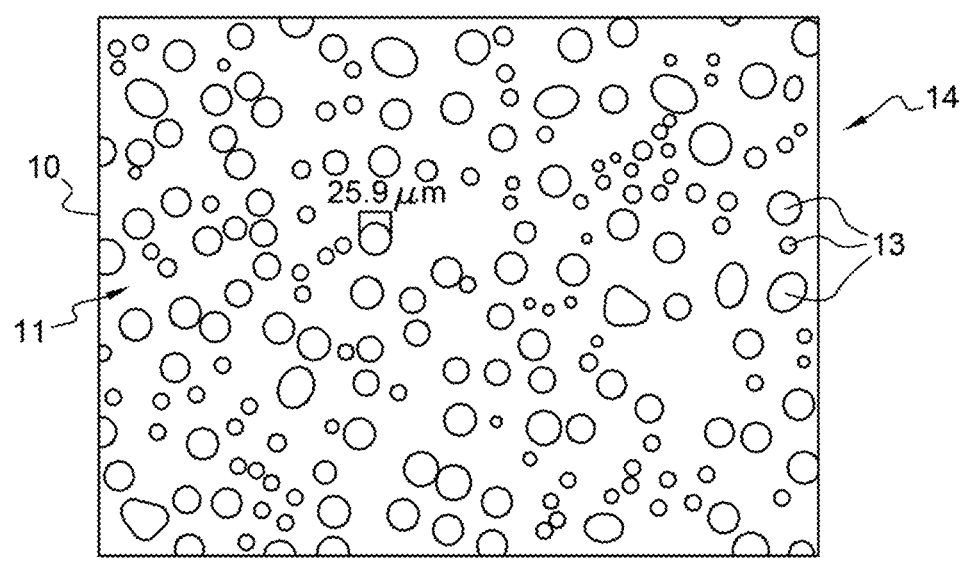
FIG. 1 is also a top view of a substrate having a textured surface according to the invention.

FIG. 1 shows a substrate 10 having a surface 11 microtextured by implementing the invention.

The substrate 10 has cavities 13 with variable shapes and sizes, open at the surface 11. The cavities 13 have widths, defined parallel to the surface 11, on the order of several tens of microns, for example 25.9 µm for one of the cavities 13 shown in FIG. 1.

The cavities 13 together form an irregular microtexturing profile 14 on the surface 11 of the substrate 10. The method of microtexturing the surface 11, consisting of arranging the cavities 13 in the substrate 10, and thus forming the microtexturing profile 14 on the surface 11, is outlined hereinafter.

Figure 2:
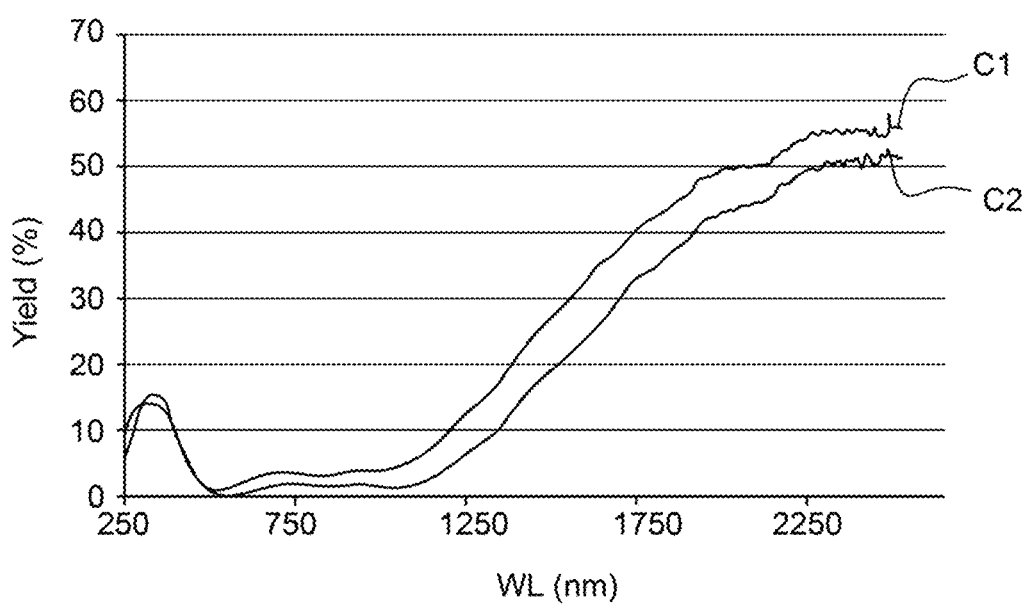
FIG. 2 is a graph showing the advantages of the invention in the context of a thermal solar application.

FIG. 2 shows an example use of the substrate 10 including an irregular microtexturing profile 14, namely the manufacturing of a spectrally selective absorber for a thermal solar application.

On the graph of FIG. 2, the x-axis represents a wavelength WL in nanometers, while the y-axis represents a reflectance R in percentage. Curve C1 corresponds to a solar absorber placed on a flat surface, while curve C2 corresponds to an identical solar absorber placed on the surface 11 having the irregular microtexturing profile 14 shown in FIG. 1. In this example, the absorber is made from TiAlN (titanium-aluminum nitride).

Compared with the planar absorber, it will be noted that the textured absorber has a better absorption of the solar spectrum in the visible (380-700 nm) and near infrared (700-2500 nm) wavelengths. The absorption is defined as the integral of the absorbance over the range of wavelengths considered above (380-2500 nm).

FIGS. 3 to 9 show different component elements of a microtexturing plant 1 according to the invention, implemented to texture the surface 11 of the substrate 10. The plants 1 comprises various devices 40, 50 and 60.

Within the plant 1, the invention in particular relates to a system 2 for producing an optical mask 35 made up of an arrangement 31 of droplets 30, as outlined hereinafter. The system 2 comprises the device 40.

In the example of FIGS. 3 to 8, the substrate 10 has a parallelepiped shape. The substrate 10 has an upper surface 11 and a lower surface 12, which are planar and parallel to one another.

Alternatively, the substrate 10 may have any shape suitable for the targeted application, for example a tubular shape.

By way of examples, the substrate 10 can be made from silicon, glass, polymer, metal, etc.

The substrate 10 also has a layer of material 20 covering the surface 11 to be textured. This covering of the surface 11 with the layer 20 can be complete or partial. The layer 20 can be deposited on the surface 11 of the substrate 10 using any suitable method, for example by spin coating. The layer 20 is preferably made from photosensitive material, for example from a polymer such as S1805 resin, which is relatively hydrophobic. The hydrophobic nature of the material of the layer 20 influences the formation of the droplets 30.

As an example, the substrate 10 has a thickness of about 1 to 2 mm, while the layer 20 has a thickness of about 100 nm to 500 nm. In the figures, these thicknesses are shown with a same order of magnitude for simplification reasons.

The layer 20 has an upper surface 21 and a lower surface 22. The surface 21 can be described as outer surface, since it is exposed to the outside environment, while the surface 22 can be described as inner surface, since it is positioned against the surface 11, and therefore arranged between the layer 20 and the substrate 10.

The surface 21 can receive a chemical pretreatment to change its wettability, in whole or in part, for example by using a plasma method or a wet method.

Figure 3:
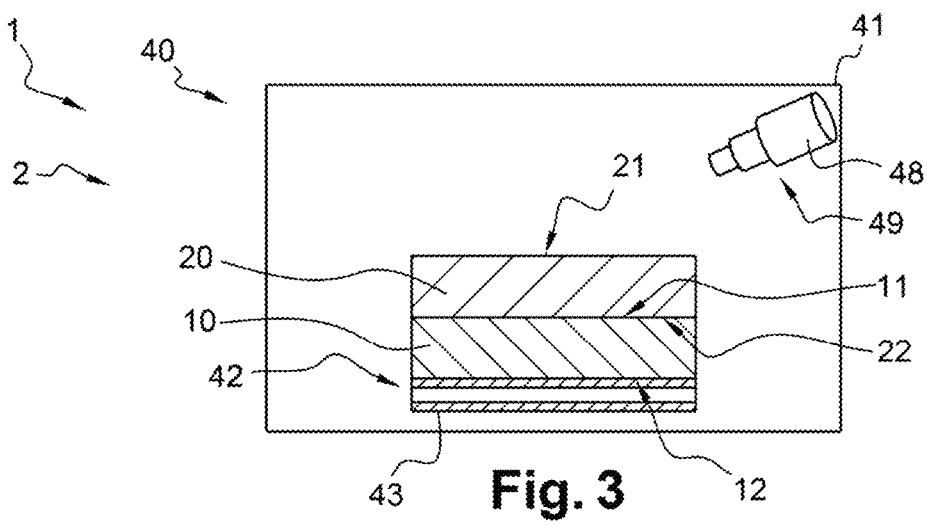
FIGS. 3 to 9 are sectional views showing different component elements of a surface microtexturing plant according to the invention, implementing a positive photosensitive resin, and focusing droplets having variable shapes and sizes as well as an irregular spatial distribution.
Figure 4:
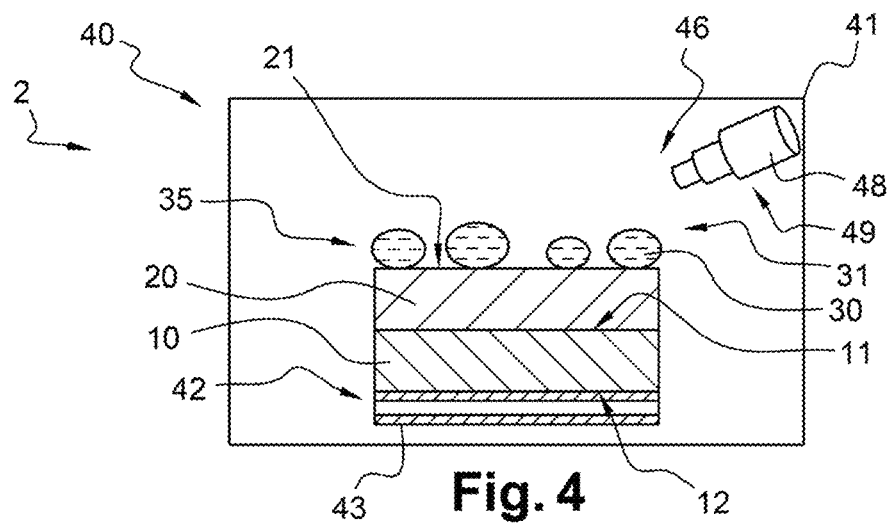
Figure 5:
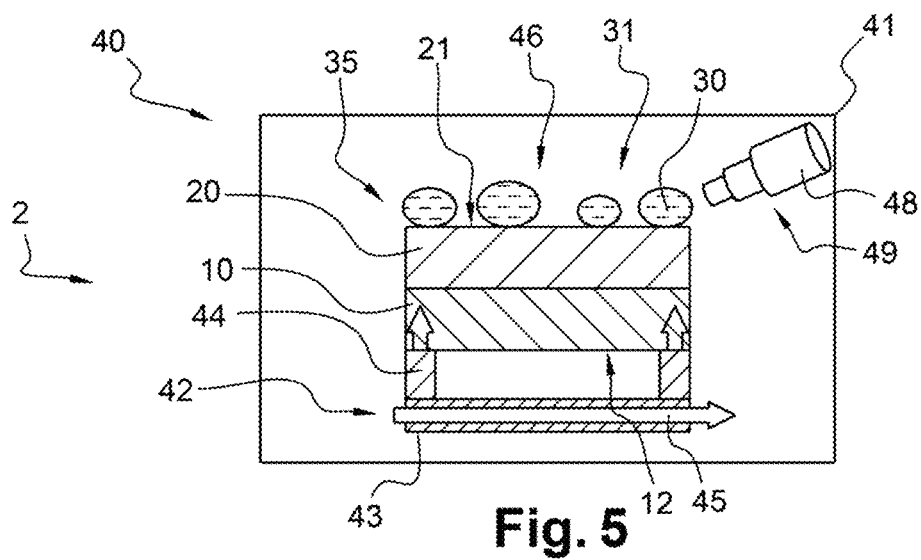

FIGS. 3 to 5 show the substrate 10 positioned in a generating and depositing device 40, provided to generate droplets 30, then to deposit them on the surface 21 of the layer 20.

The device 40 comprises a closed chamber 41 and a cooling unit 42 arranged in the chamber 41. The substrate 10 covered with the layer 20 is initially arranged on the unit 42, such that the surfaces 11 and 21 are oriented upward. The chamber 41 has a gaseous atmosphere 46 with a controlled temperature and humidity.

The unit 42 makes it possible to cool the lower surface 12 of the substrate 10, then the surface 21, by thermal conduction. By acting on the temperature difference between the surface 21 and the atmosphere 46 of the chamber 41, it is possible to produce condensation from the gas present in the atmosphere 46, if the partial pressure of this gas in the chamber 41 is sufficient. Generally, the gas present in the atmosphere 46 is water vapor, but other gases can be used, for example oil or silicone vapors.

The unit 42 comprises a support 43 and retractable feet 44. The support 43 is a metal plate, through which a cold-water stream 45 with a controlled temperature passes. For example, the stream 45 has a temperature of about 5° C. Alternatively, the stream 45 can be made up of another fluid suitable for the targeted application, such as glycol water or liquid nitrogen. The heat exchanges can be improved by polishing the support 43 and/or arranging a film of water between the surface 12 and the support 43. The feet 44 can be actuated to place the surface 12 of the substrate 10 in contact with the support 43, like in FIG. 4, or to move this surface 12 away from the support 43, like in FIG. 5.

When the surface 12 is positioned against the support 43, the temperature of the substrate 10, then of the layer 20, decreases. The cooling of the surface 21 increases the condensation of the droplets 30. When the arrangement 31 of the droplets 30 is satisfactory, the feet 44 are actuated to move the substrate 10 away from the support 43 and stop the condensation. Thus, the unit 42 makes it possible to control the condensation of the droplets 30 on the surface 21. The arrangement 31 is considered to be satisfactory when the shapes, sizes and distribution of the droplets 30 are compliant with the preset criteria depending on the targeted application. For example, in the case of the thermal solar application illustrated in FIGS. 1 and 2, getting droplets 30 having a size of around several tens of micrometers and a distribution of about 50 to 150 droplets per $mm^2$ make up two criteria to be met. The criteria are defined on a case-by-case basis for each application.

The device 40 also comprises a unit 48 for monitoring the arrangement 31 of the droplets 30 on the surface 21. The unit 48 for example comprises a laser camera 49, a microscope, a stereoscopic microscope or any other imaging system. The unit 48 makes it possible to monitor the condensation of the droplets 30 in situ, directly in the chamber 41. Thus, the stopping of the condensation of the droplets 30 is made much easier, when the arrangement 31 is in accordance with the desired result regarding the shapes, sizes and distribution of the droplets 30.

The droplets 30 condense on the surface 21 according to an irregular and random spatial arrangement 31. More specifically, the droplets 30 have variable shapes and sizes, as well as an irregular spatial distribution.

The arrangement 31 of the droplets 30 can be modified by acting on various factors, such as the amplitude of the temperature difference between the surface 21 and the atmosphere 46, the partial pressure of the water vapor and therefore the relative humidity in the chamber 41, the duration of the condensation, the pretreatments applied on the surface 21 before depositing the droplets 30, etc.

After deposition and condensation, the droplets 30 disturbed according to the arrangement 31 form the optical mask 35 on the surface 21 of the layer 20. The substrate 10 having the layer 20 and the droplets 30 can then be removed from the chamber 41.

Figure 6:
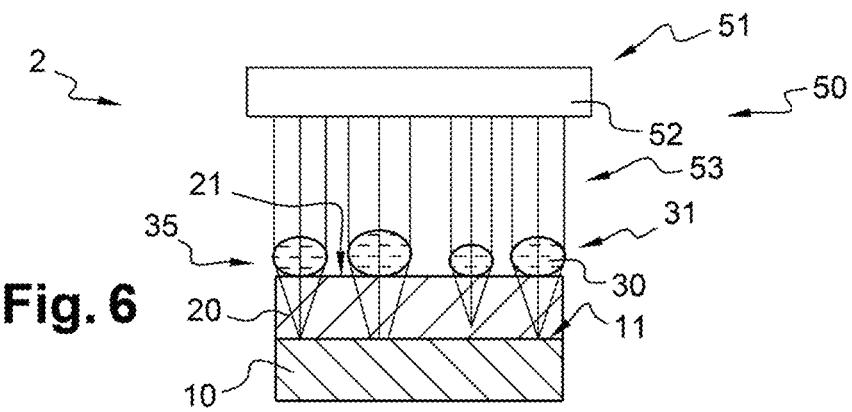
Figure 7:
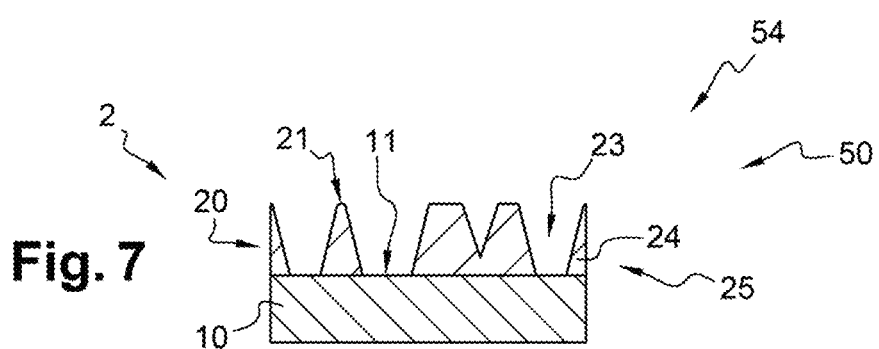

FIGS. 6 and 7 show a device 50 for localized removal of the layer of material 20, based on the arrangement 31 of the droplets 30 on the surface 21, to form a mask 25 on the substrate 10. More specifically, the step of localized removal of the layer 20 comprises an exposure sub-step shown in FIG. 6, and a developing sub-step shown in FIG. 7. The device 50 comprises an exposure unit 51 and developing unit 54.

FIG. 6 shows the exposure unit 51 comprising a light source 52, for example an ultraviolet radiation bulb. The source 52 emits a light flow 53 that passes through the droplets 30 to reach the surface 21. At this stage, each of the droplets 30 makes up a convex aspherical lens locally concentrating the light flow 53. The focal length of each lens depends on the shape of the droplet 30. The material layer 20 of photosensitive resin is affected by the light beam 53 focused by the droplets 30, which locally increase the received dose of exposure.

In the example of FIGS. 6 to 9, the layer 20 is made from positive photosensitive resin, and the droplets 30 perform an optical function of concentrating the light flow 53. The zones of the layer 20 that are exposed to the beam 53 become soluble to the developer, while the zones of the layer 20 that are exposed little or not at all remain insoluble.

After exposure, the substrate 10 and the layer 20 are dried with nitrogen, then transferred to the developing unit 54. The developing technique depends on the material of the layer 20. For example, if the layer 20 is made from S1805 resin, the developing consists of dipping the layer in a MF319 solution, comprising about 97 to 98% water and 2.45% tetramethylammonium hydroxide.

In order to obtain a profile 14 having a higher density of patterns on the surface 11, it is possible to perform several condensation, exposure and drying cycles before developing.

FIG. 7 shows the layer of material 20 after developing by the unit 54. The layer 20 then includes material removal zones 23 and remaining material zones 24. The layer 20 thus forms the mask 25, which is arranged on the substrate 10. The zones 23 and 24 have variable sizes, resulting from the irregular arrangement 31 of the droplets 30 of FIG. 6.

In the example of FIG. 7, the layer 20 is made from positive photosensitive resin. The zones 23 are located directly below the droplets 30 of FIG. 6 in the form of holes, while the zones 24 are located around and between the droplets 30 of FIG. 6.

Figure 8:
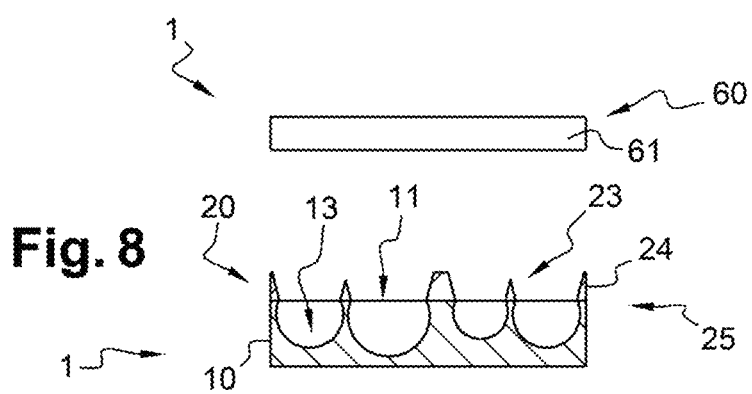

FIG. 8 shows a device 60 for microtexturing of the surface 11 through the mask 25. The arrangement of the cavities 13, and therefore the microtexturing profile 14 formed on the surface 11, depend on the arrangement of the zones 23 and 24 of the layer 20 forming the mask 25. The microtexturing can be done using a wet method, a dry method or laser ablation, in particular depending on the material of the substrate 10 and the targeted application.

In the example of FIG. 8, the device 60 has a reactive ion etching unit 61. Alternatively, the device may have a chemical etching unit, an optical etching unit (ablation) or any other etching unit suitable for the targeted application. For example, when the substrate 10 is made from aluminum, the surface 11 may be etched by immersion in a mixture of phosphoric acid and nitric acid (Transene Aluminum Etchant Type A©).

After etching, the resin residues of the layer 20 may be removed using different methods, for example by immersion in acetone, or by ultrasonic agitation. The selected method in particular depends on the materials of the substrate 10 and the layer 20.

Figure 9:
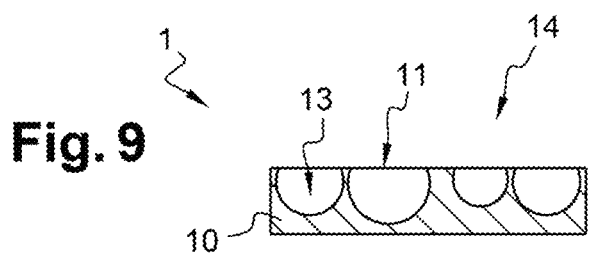

FIG. 9 shows the final substrate 10, having the cavities 13 distributed according to the microtexturing profile 14. Since the arrangement 31 of the droplets 30 was irregular, the cavities 13 have irregular shapes and sizes and an irregular distribution.

One practical embodiment of the invention is defined below. This example relates to the manufacture of a spectrally selective absorber for a thermal solar application.

The results of FIGS. 1 and 2 are obtained by implementing the plant 1 of FIGS. 3 to 9 with the following parameters:

The substrate 10 is made from 304L stainless steel and has a parallelepiped shape, with a thickness of 1 mm, a length of 50 mm and a width of 50 mm. The layer 20 is made from a S1805 photosensitive resin and has a thickness of 300 nm.

The layer 20 is deposited on the surface 11 of the substrate 10 by spin coating.

The surface 21 of the layer 20 does not receive a pretreatment.

The chamber 41 has a height of 300 mm, a length of 200 mm and a width of 200 mm.

The support 43 is made from steel. Its upper surface is not polished and does not receive a film of water before receiving the substrate 10.

The stream of cold water 45 circulates in the support at a temperature of 5° C.

The atmosphere 46 in the chamber 41 initially has a temperature of 25° C. and a humidity of 50%.

The droplets 30 formed on the surface 21 of the layer 20 by condensation in the chamber 41 are made up of water, having a refraction index on the order of 1.33. These droplets 30 have half-ellipse shape, a size between 10 μm and 50 μm, and a distribution on the order of 160 to 400 droplets 30 per 1 mm$^2$.

The light source 52 is an ultraviolet radiation bulb, emitting on a wavelength between 365 and 435 nm. The power of the bulb is 100 W. The exposure duration of the layer 20 is 10 seconds.

The developing unit 54 implements a MF319 solution having between 97 to 98% water and 2.45% tetra methyl ammonium hydroxide, in which the layer 20 is dipped after exposure by the light flow 53. The developing lasts several seconds.

The microtexturing device 60 comprises a reactive ion etching unit 61.

After etching, the resin residues of the layer 20 are removed from the substrate 10 by immersion in acetone.

The cavities 13 formed on the surface 11 of the substrate 10 have widths and depths on the order of several tens of microns.

The plant 1 for microtexturing the surface 11 and the system 2 for producing the optical mask 35 can be configured differently from FIGS. 3 to 9 without going beyond the scope of the invention.

Depending on the liquid making up the droplets 30, obtained by condensation of the gas in the chamber 41, the droplets 30 can serve as optics for concentration or occultation of the light flow 53 in the device 50.

The droplets 30 can be made up of water, an aqueous solution, oil, liquid polymer (for example silicone), metal, etc.

The composition of the droplets 30 modifies their optical refraction index, making it possible to change the focus in the case of a concentrating optics. Additionally, the composition of the droplets 30 changes their surface tension on the layer 20, allowing a change in shapes, sizes and dimensional distribution of the droplets 30.

The table below indicates different compositions of the droplets 30 and the corresponding indices of refraction.

| LIQUID | INDEX OF REFRACTION |
| --- | --- |
| Water | 1.33 |
| Acetone | 1.36 |
| Glycerin | 1.47 |
| Benzene | 1.5 |
| Silicone oil | 1.33-1.58 |
| Sodium chloride | 1.54 |
| Ethanol | 1.36 |
| 10% glucose in water | 1.348 |
| 20% glucose in water | 1.363 |
| 30% glucose in water | 1.439 |

FIGS. 10 to 13 provide a more detailed illustration of the exposure sub-step shown in FIG. 6, and the developing sub-step shown in FIG. 7, considering a single droplet 30.

Figure 10:
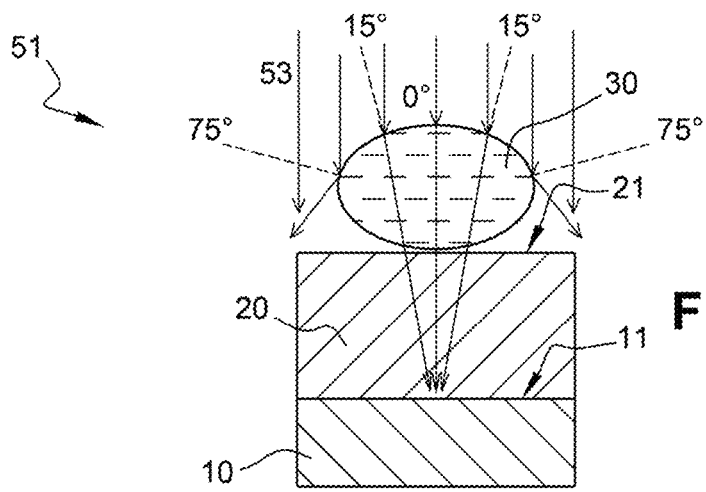
FIG. 10 is a sectional view similar to FIG. 6, on a larger scale, considering a single droplet.

FIG. 10 shows the light flow 53 reaching the surface of the droplet 30 in the form of a collimated beam. The rays form different angles of incidence at the air/drop interface, following the meeting point of the incident ray with the curved surface of the drop. Thus, the closer the light ray strikes the drop to its end, the higher the angle of incidence is. Yet the reflectance at the air/drop interface depends on the angle of incidence.

Figure 11:
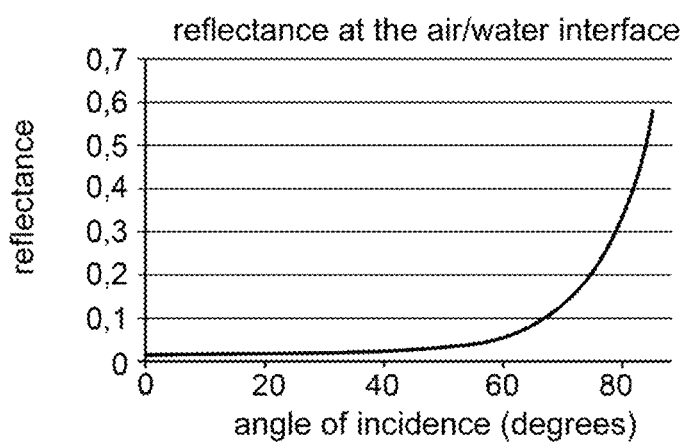
FIG. 11 is a graph illustrating the evolution of the reflectance as a function of the angle of incidence at the air/water interface.

The graph in FIG. 11 illustrates the evolution of the reflectance (on the y-axis) as a function of the angle of incidence (on the x-axis) at the air/water interface. It will be noted that the reflectance increases greatly when the angle of incidence exceeds 60°. The quantity of light received by the layer 20 on the edges of the droplet 30 is therefore small due to the high reflectivity, related to a grazing incidence. The droplet 30 focuses the light at its center, but protects and masks the layer 20 on its edges.

Figure 12:
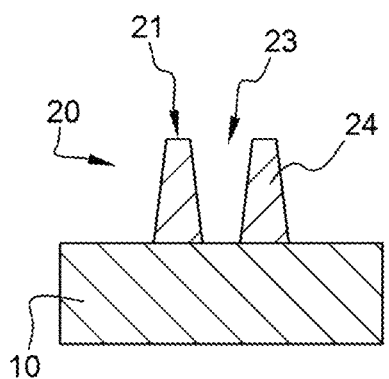
FIG. 12 is a sectional view similar to FIG. 7, on a larger scale, showing the resin of FIG. 10 after developing.
Figure 13:
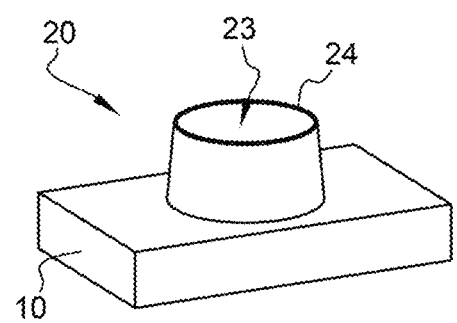
FIG. 13 is a perspective view of the resin of FIG. 12.

FIGS. 12 and 13 show the photosensitive material layer 20 after developing, under the droplet 30. The result is obtaining a structure with a tubular geometry.

FIGS. 14 to 18 show other examples of surfaces 11 obtained by implementing the invention.

In FIGS. 14 and 15, the cavities 13 have a crater shape, with a deeper hollow 15 than the surface 11 and rims 16 higher than the surface 11. As explained above in reference to FIGS. 10 to 13, each of the droplets 30 focuses the beam 53 at its center, and conceals the light at its periphery due to a high angle of incidence. The S1805 photosensitive resin used for the layer 20 is said to be positive. The removal of the zones of the layer 20 that are most exposed to the UV light is therefore significant during the developing (with a MF319 basic developer), which explains the resulting structure of the surface 11.

In FIGS. 16 and 17, the cavities 13 have another crater shape, with a hollow 15 whose bottom is located at the level of the surface 11, while the rims 16 are higher than the surface 11. The shape of the droplets 30 is different from that implemented in the example of FIGS. 14 and 15 owing to a different cooling time. This different drop shape makes it possible to change the focus of the beam 53 on the layer 20. Thus, variable droplet shapes 30 cause a variable exposure of the resin.

FIG. 18 shows a substrate 10 in perspective view, which makes it possible to better see the shape of the craters. This FIG. 18 has been obtained by scanning the surface 11 shown in FIG. 14 using a tactile profilometer.

FIGS. 19 to 30 show different alternative embodiments of the invention. For simplification purposes, the elements similar to the first embodiment described above bear the same numerical references.

In the embodiment from FIGS. 19 to 22, the layer 20 is made from negative photosensitive resin, and the droplets 30 perform an optical function of concentrating the light flow 53.

In FIG. 19, during the exposure by the unit 51, the zones of the layer 20 that are exposed to the beam 53 become insoluble to the developer, while the zones of the layer 20 that are exposed little or not at all remain soluble.

FIG. 20 shows the layer of material 20 after developing by the unit 54. The layer 20 thus forms the mask 25, which is arranged on the substrate 10. The removal zones 23 are located around and between the droplets 30 of FIG. 19, while the zones 24 are located below the droplets 30 of FIG. 19 in the form of material columns.

FIG. 21 shows the microtexturing of the surface 11 through the mask 25. The arrangement of the cavities 13, and therefore the microtexturing profile 14 formed on the surface 11, depend on the arrangement of the zones 23 and 24 of the layer 20 forming the mask 25. After etching, the resin residues of the layer 20 are removed from the substrate 10.

FIG. 22 shows the final substrate 10, having the cavities 13 distributed according to the microtexturing profile 14. Since the arrangement 31 of the droplets 30 was irregular, the cavities 13 have irregular shapes and sizes and an irregular distribution.

Figure 23:
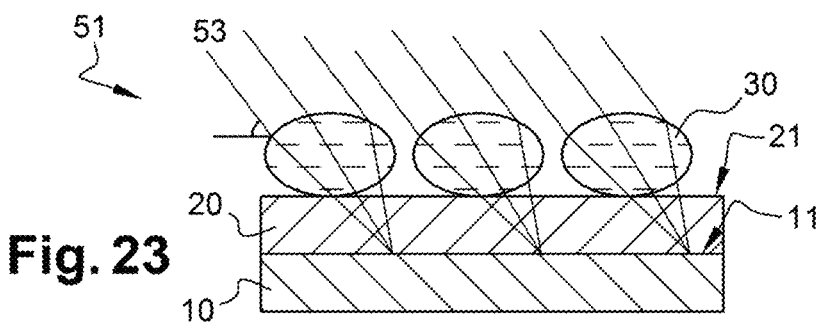
FIGS. 23 and 24 are sectional views respectively similar to FIGS. 6 and 7, for an alternative of the invention implementing an oblique beam.
Figure 24:
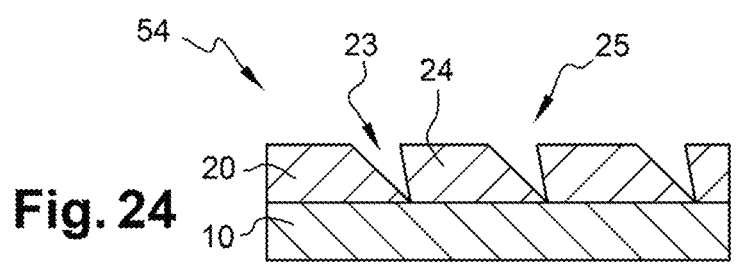
Figure 25:
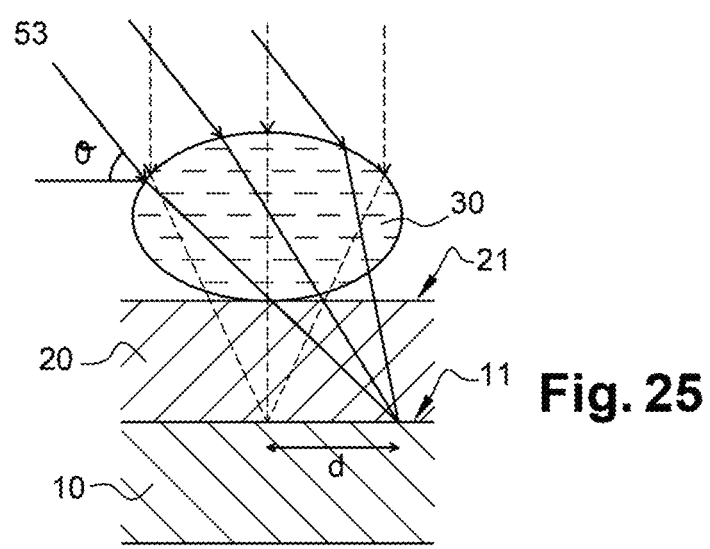
FIG. 25 is a sectional view similar to FIG. 23, on a larger scale.

In the embodiment of FIGS. 23 to 25, the light beam 53 is oriented on the droplets 30 at an oblique angle of incidence, relative to a direction normal to the surface 21 of the layer 20. Under these conditions, the pattern forming the mask 25 is also oblique.

As shown in FIG. 26, this pattern is translated by a distance "d" relative to the center of the droplet 30, as a function of the angle of incidence of the light beam 53.

In the embodiment of FIGS. 26 to 28, the layer 20 is subject to a multiple exposure, under a beam 53 having an oblique angle of incidence, combined with a rotation of the substrate 10.

As shown in FIG. 26, the layer 20 is exposed to a beam 53 having an oblique angle of incidence, then the substrate 10 pivots by 180° around an axis normal to the surface 21, then the layer 20 is exposed again to a beam 53 having an oblique angle of incidence.

As shown in FIGS. 27 and 28, during an exposure under an angle of incidence different from the normal, it is possible to obtain pattern geometries other than cylindrical, due to the translation of the inscribed pattern relative to the center of the droplet 30.

Figure 29:
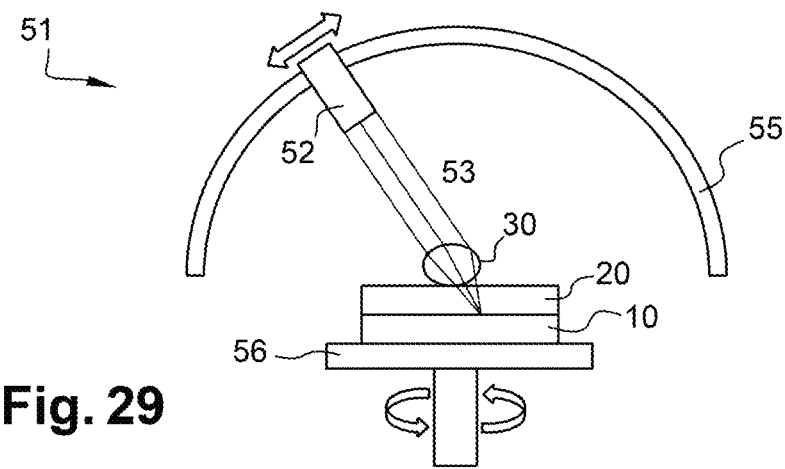
FIG. 29 is a view similar to FIG. 23, on a smaller scale, showing an example exposure unit.

FIG. 29 shows an example exposure unit 51 designed to expose the droplets 30 and the layer 20 to an oblique light beam 53.

The unit 51 comprises a hemispherical rail 55, on which the light source 52 is mounted, for example a collimated UV light. Moving the source 52 along the rail 55 makes it possible to modify the angle of incidence of the beam 53 used to expose the photosensitive layer 20.

The unit 51 also comprises a rotatable platen 56, receiving the substrate 10. The platen 56 makes it possible to rotate the substrate 10 and the layer 20 between each exposure operation of the photosensitive layer 20.

Figure 30:
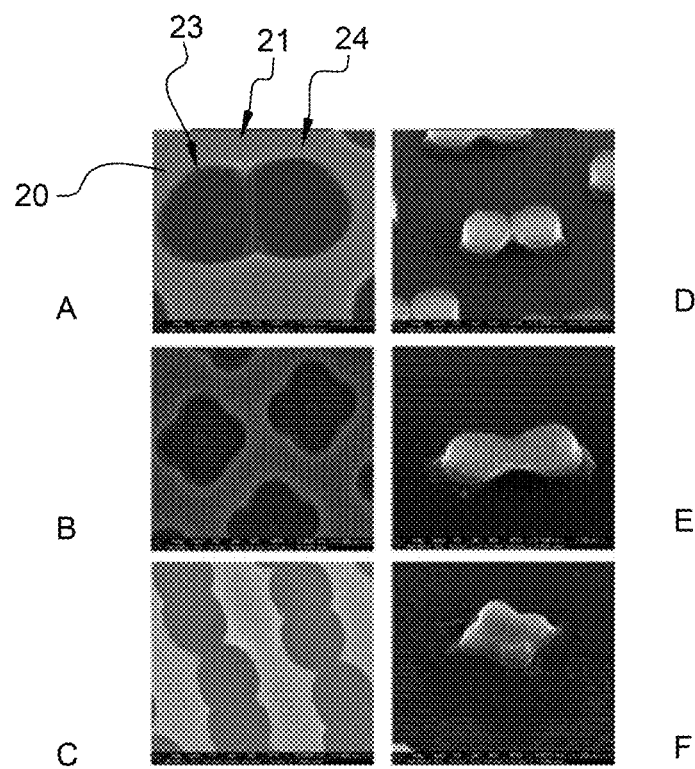
FIG. 30 shows different photographs taken by scanning electron microscope, showing different examples of resin layers after exposure under oblique beam, then developing.

FIG. 30 shows different examples of resin layers 20 after exposure under an oblique beam, then developing.

On the left, examples A, B and C are obtained with a positive photosensitive resin, while on the right, examples D, E and F are obtained with a negative photosensitive resin.

Examples A, C, D and E each show a layer 20 subject to two successive exposures under oblique incidence, with a rotation of 180° between each exposure, making it possible to obtain a "bow tie" pattern.

Examples B and F each show a layer 20 subject to four successive exposures under oblique incidence, with a rotation of 90° between each exposure, making it possible to obtain a "four-leaf clover" pattern.

Such patterns are for example applicable in chemical analysis (field concentration, plasmonic effect) and in microbiology.

The technical characteristics of the various embodiments and variants mentioned in the present description can be, in whole or for some of them, combined with each other. Thus, the plant 1 and the system 2 can be adapted in terms of cost, functionalities and performance.

The invention claimed is:

1. A system for producing a mask for surface microtexturing, the system comprising:
   a substrate having a surface to be textured;
   a layer of material made from photosensitive material which covers the surface of the substrate and has an outer surface that is exposed to the outside environment;
   a generating and depositing device for generating and depositing droplets on the outer surface of the layer of material, in a specific arrangement by condensation, forming an optical mask on the outer surface of the layer of material, and
   a localized removal device for localized removal of the layer of material, based on the arrangement of the droplets forming the optical mask on the outer surface of the layer of material, which then includes removal zones and material zones forming a second mask on the substrate,
   wherein the localized removal device for the layer of material comprises an exposure unit emitting a light flow that passes through the droplets and reaches the outer surface of the layer of material, and a unit for developing the layer of material after exposure to the light flow, wherein the exposure unit comprises a light source that is tilted relative to a direction normal to the outer surface of the layer of material, and the light flow passes through the droplets and reaches the outer surface of the layer of material under oblique incidence.

2. The system according to claim 1, wherein the generating and depositing device comprises a closed chamber, having a gaseous atmosphere with a controlled temperature and humidity, such that the droplets condense in a controlled manner on the outer surface of the layer of material.

3. The system according to claim 1, wherein the generating and depositing device comprises a unit for cooling a lower surface of the layer of material.

4. The system according to claim 1, wherein the generating and depositing device comprises a unit for monitoring, by imaging, the arrangement of the droplets on the outer surface of the layer of material.

5. The system according to claim 1, wherein the layer of material is made from positive photosensitive material, such that the removal zones of the layer of material are located directly below the droplets.

6. The system according to claim 1, wherein the layer of material is made from negative photosensitive material, such that the removal zones of the layer of material are located around and between the droplets.

7. The system according to claim 1, wherein the light source is mounted on a hemispherical rail.

8. The system according to claim 1, wherein the exposure unit comprises a platen receiving the substrate and rotatable to turn the layer of material relative to the light flow.

9. A surface treatment plant, comprising:
a system for producing a mask on a substrate according to claim 1; and
a microtexturing device for microtexturing of the surface of the substrate through the mask formed by the layer of material on the substrate.

10. A method for producing a mask for surface microtexturing, said method comprising the following steps:
a step of providing a substrate having a surface to be textured;
a step of providing a layer of material which covers the surface of the substrate and has an outer surface that is exposed to the outside environment; and
a step of generating and depositing droplets on the outer surface of the layer of material, in a specific arrangement, thus forming an optical mask on the outer surface of the layer of material; and
a step of localized removal of the layer of material, based on the arrangement of the droplets forming the optical mask on the outer surface of the layer of material, which then includes removal zones and material zones forming a second mask on the substrate,
wherein during the step of localized removal of the layer of material, a light flow passes through the droplets and reaches the outer surface of the layer of material under oblique incidence.

11. A surface treatment method, comprising the following successive steps:
a) a step of providing a substrate that includes a surface to be textured;
b) a step of providing a layer of material which covers the surface of the substrate and has an outer surface that is exposed to the outside environment;
c) a step of generating and depositing droplets on the outer surface of the layer of material, in a specific arrangement by condensation, thus forming the optical mask on the outer surface of the layer of material; and
d) a step of localized removal of the layer of material, based on the arrangement of the droplets forming the optical mask on the outer surface of the layer of material, which then includes removal zones and material zones forming a second mask on the substrate; and
e) a step of microtexturing of the surface of the substrate through the second mask formed by the layer of material on the substrate,
wherein during the step of localized removal of the layer of material, a light flow passes through the droplets and reaches the outer surface of the layer of material under oblique incidence.

12. The surface treatment method according to claim 11, wherein during the step of localized removal of the layer of material, the layer of material pivots relative to the light flow between two exposures, such that the layer of material is exposed under different oblique incidences.

* * * * *